(12) United States Patent
Miyazawa

(10) Patent No.: US 10,672,869 B2
(45) Date of Patent: Jun. 2, 2020

(54) INSULATED-GATE SEMICONDUCTOR DEVICE

(71) Applicant: FUJI ELECTRIC CO., LTD., Kawasaki (JP)

(72) Inventor: Shigemi Miyazawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/255,042

(22) Filed: Jan. 23, 2019

(65) Prior Publication Data
US 2019/0288064 A1 Sep. 19, 2019

(30) Foreign Application Priority Data

Mar. 19, 2018 (JP) .................................. 2018-50835

(51) Int. Cl.
| | |
|---|---|
| H01L 29/06 | (2006.01) |
| H01L 29/417 | (2006.01) |
| H01L 29/423 | (2006.01) |
| H01L 29/739 | (2006.01) |
| H01L 29/66 | (2006.01) |
| H01L 29/10 | (2006.01) |
| H01L 29/49 | (2006.01) |
| H01F 38/12 | (2006.01) |
| H01L 27/02 | (2006.01) |

(Continued)

(52) U.S. Cl.
CPC ...... *H01L 29/0696* (2013.01); *H01L 29/1033* (2013.01); *H01L 29/41708* (2013.01); *H01L 29/4238* (2013.01); *H01L 29/66333* (2013.01); *H01L 29/7395* (2013.01); *H01F 38/12* (2013.01); *H01L 21/0217* (2013.01); *H01L 21/02271* (2013.01); *H01L 21/266* (2013.01); *H01L 21/26513* (2013.01); *H01L 21/28035* (2013.01); *H01L 21/28518* (2013.01); *H01L 21/28525* (2013.01); *H01L 21/31116* (2013.01); *H01L 27/0255* (2013.01); *H01L 29/4916* (2013.01)

(58) Field of Classification Search
CPC ..................... H01L 29/0696; H01L 29/4238
See application file for complete search history.

(56) References Cited

U.S. PATENT DOCUMENTS

2018/0212028 A1* 7/2018 Kuno ................ H01L 29/66348

FOREIGN PATENT DOCUMENTS

| JP | 10-112541 A | 4/1998 |
|---|---|---|
| JP | 2004-363327 A | 12/2004 |

* cited by examiner

*Primary Examiner* — Farun Lu

(57) ABSTRACT

An insulated-gate semiconductor device has a multi-channel structure with a plurality of unit-cells arranged in parallel on a semiconductor chip, wherein a main-electrode causing a main current to flow in the semiconductor chip is defined so as to be divided into an inter-electrode portion metallurgically connected to the semiconductor chip between gate electrodes of each of the unit-cells and a covering portion being continuous with the inter-electrode portion and provided on the gate electrode of each of the unit-cells through an interlayer insulating film, wherein an area ratio of the inter-electrode portion to the covering portion of the main-electrode exposed to an opening cut in a protective film covering the semiconductor chip is larger than an area ratio of the inter-electrode portion to the covering portion of the main-electrode located under the protective film.

6 Claims, 13 Drawing Sheets

(51) Int. Cl.
*H01L 21/265* (2006.01)
*H01L 21/266* (2006.01)
*H01L 21/28* (2006.01)
*H01L 21/285* (2006.01)
*H01L 21/02* (2006.01)
*H01L 21/311* (2006.01)

US 10,672,869 B2

INSULATED-GATE SEMICONDUCTOR DEVICE

CROSS-REFERENCE TO RELATED APPLICATION

This application claims benefit of priority under 35 USC 119 based on Japanese Patent Application No. 2018-050835 filed on Mar. 19, 2018, the entire contents of which are incorporated by reference herein.

BACKGROUND OF THE INVENTION

1. Field of the Invention

The present invention relates to an insulated-gate semiconductor device suitable for a power switching element.

2. Description of the Related Art

A power semiconductor device is known as a power switching element such as an igniter. In such a power semiconductor device, a thermal cycle (temperature cycle) in which heat generation and heat dissipation is repeated according to on/off operation occurs, and thus, the device is damaged. In particular, deterioration such as cracks occurs in the electrode of the power semiconductor device, as the temperature cycle is the largest in the electrode, and a high power is applied to the electrode.

JP 10-112541 A has proposed a scheme such that setting the size of a source-side unit-cell on a source-side lead connecting portion, which connects a source electrode wiring and an external lead, to be larger than the size of a gate-side unit-cell on a gate-side lead connecting portion connecting a gate electrode and the external lead. In addition, JP 2004-363327 A has proposed a scheme of arranging central unit-cells sparsely in the central portion of the chip, the central portion has a large heat generation amount and a poor heat dissipation property, and arranging peripheral unit-cells densely in the peripheral portion of the chip, the peripheral portion has a small heat generation amount and a good heat dissipation property. However, the schemes of JP 10-112541 A and JP 2004-363327 A do not consider the relationship between an unit-cell located under a protective film covering the entire insulated-gate semiconductor device and an unit-cell located at an opening of the protective film.

In view of the above-mentioned problems, the invention is to provide an insulated-gate semiconductor device capable of suppressing a deterioration of an electrode caused by a temperature cycle in which ON-operations and OFF-operations are repeated while suppressing a deterioration in electrical characteristics and an increase in chip size.

SUMMARY OF THE INVENTION

An aspect of the present invention inheres in an insulated-gate semiconductor device having a multi-channel structure with a plurality of unit-cells arranged in parallel on a semiconductor chip, including: a main-electrode configured to flow a main current in the semiconductor chip, the main-electrode having: an inter-electrode portion metallurgically connected to the semiconductor chip between a plurality of gate electrodes of the unit-cells, and a covering portion being continuous with the inter-electrode portion, configured to cover the gate electrodes through an interlayer insulating film on the gate electrodes; and a protective film partially covering the main-electrode, wherein an area ratio of the inter-electrode portion to a part of the covering portion, which is exposed by a first opening cut in the protective film, is larger than an area ratio of the inter-electrode portion to another part of the covering portion, the another part is located under the protective film.

DETAILED DESCRIPTION OF THE INVENTION

Figure 1:
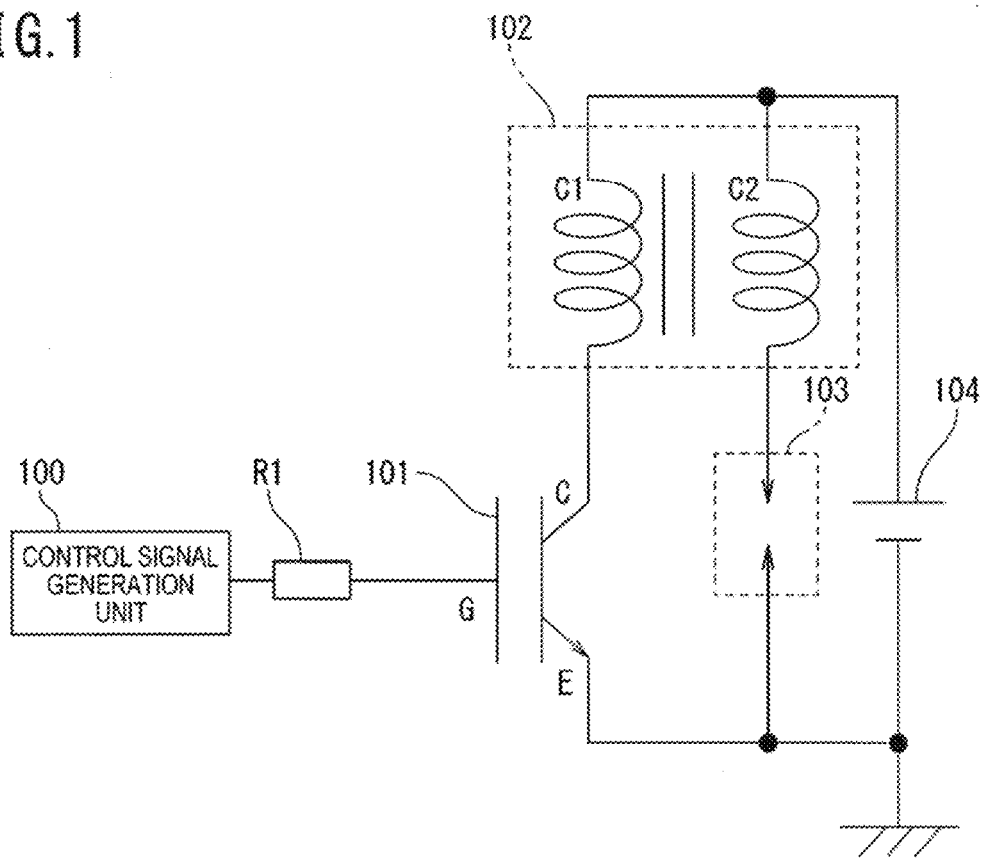
FIG. 1 is a circuit diagram illustrating an example of an ignition device having an insulated-gate semiconductor device according to an embodiment of the present invention.

With reference to the drawings, an embodiments of the present invention will be explained in detail below. In the following description of the drawings, the same or similar reference numerals are assigned to the same or similar portions. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the Specification, a "carrier-supply region" of the insulated-gate semiconductor device is assigned to a source region in a field-effect transistor (FET) or a static induction transistor (SIT), an emitter region in an insulated-gate bipolar transistor (IGBT) and an anode region region in an insulated-gate static induction (SI) thyristor, which may include a metal-insulator-semiconductor (MIS) controlled SI thyristor. A "carrier-collecting region" of the insulated-gate semiconductor device is assigned to a semiconductor region which is not assigned as the carrier-supply region and will be the drain region in the FET or the SIT, the collector region in the IGBT, and the cathode region in the insulated-gate SI thyristor.

A "main current" flows between the carrier-supply region and the carrier-collecting region. For example, a collector current corresponds to the main current in the IGBT. Furthermore, a "main-electrode" is described in the Specification, the main-electrode comprehensively means technically appropriate an ohmic electrode, which is metallurgically connected to the carrier-supply region or the carrier-collecting region.

Further, in the following description, there is exemplified a case where a first conductivity type is an n type and a second conductivity type is a p type. However, the relationship of the conductivity types may be inverted to set the first conductivity type to the p type and the second conductivity type to the n type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration.

Further, definitions of directions such as an up and down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

An insulated-gate semiconductor device 101 according to an embodiment of the present invention can be used as a switching element, which is applied to, for example, an ignition device used for ignition of an internal combustion engine of an automobile or the like as illustrated in FIG. 1. The ignition device according to the embodiment of the present invention includes an insulated-gate semiconductor device 101, an ignition coil 102, an ignition plug 103, and a power supply 104. The ignition coil 102 includes a primary coil C1 and a secondary coil C2, which is arranged in parallel with the primary coil C1. The primary coil C1 and the secondary coil C2 are provided in a distance that facilitates an electromagnetic mutual induction between the primary coil C1 and the secondary coil C2.

The secondary coil C2 and the ignition plug 103 implement a first series circuit (C2, 103) connected in parallel to the power supply 104. The first series circuit (C2, 103) is connected in parallel across the terminal of a high-level potential side, or positive potential side of the power supply 104 and the terminal of the low-level potential side, or negative potential side. The primary coil C1 and the insulated-gate semiconductor device 101 implement a second series circuit (C1, 101) connected in parallel to the first series circuit (C2, 103).

The ignition device according to the embodiment further includes a resistor R1 connected to a gate electrode G of the insulated-gate semiconductor device 101, a control signal generation unit 100 that is connected to the resistor R1 and supplies a gate voltage to the insulated-gate semiconductor device 101 through the resistor R1. The control signal generation unit 100 is built in, for example, an electronic control unit (ECU) mounted in an automobile. The control signal generation unit 100 generates a switching control signal for controlling on and off switchings of the insulated-gate semiconductor device 101. The control signal generation unit 100 supplies the generated switching control signal to the gate electrode G of the insulated-gate semiconductor device 101 through the resistor R1.

The ignition coil 102 supplies a high voltage for generating an electric spark in the ignition plug 103 as an electric signal to the ignition plug 103. The ignition coil 102 may serve as a transformer, in addition to the function of the spark coil. One end of the primary coil C1 is connected to one end of the secondary coil C2 and further connected to the positive electrode side of the power supply 104. The primary coil C1 is smaller than the secondary coil C2 in the number of windings and shares the core with the secondary coil C2. The other end of the secondary coil C2 is connected to the central electrode of the ignition plug 103. The secondary coil C2 generates an electromotive force, or a mutually induced electromotive force according to the electromotive force generated in the primary coil C1. The secondary coil C2 supplies the generated electromotive force to the ignition plug 103 for discharging.

The power supply 104 can be implemented by, for example, a battery of an automobile. The power supply 104 supplies a voltage to the ignition coil 102. The power supply 104 supplies a predetermined constant voltage (for example, 14 volts) to, for example, one ends of the primary coil C1 and the secondary coil C2.

The ignition plug 103 electrically generates a spark by discharging. The ignition plug 103 is discharged by an applied voltage of, for example, about 10 kV or more. The ignition plug 103 is provided in the internal combustion engine and ignites a combustion gas such as an air-fuel mixture in the combustion chamber. For example, the ignition plug 103 is provided in a through hole penetrating from the outside of the cylinder to the combustion chamber inside the cylinder and is fixed so as to seal the through hole. In this case, one end of the ignition plug 103 is exposed to the combustion chamber, and the other end of the ignition plug receives an electric signal from the outside of the cylinder.

The insulated-gate semiconductor device 101 switches conduction and non-conduction between the other end of the primary coil C1 of the ignition coil 102 and the low-level potential according to the switching control signal supplied from the control signal generation unit 100. For example, the insulated-gate semiconductor device 101 causes the other end of the primary coil C1 and the low-level potential to be conductive according to the switching control signal of a high-level voltage as a turn-on voltage and causes the primary coil C1 and the low-level potential to be non-conductive according to the switching control signal of a low-level voltage, serving as a turn-off voltage. Herein, the "low-level potential" may be a reference potential for the entire control system of an automobile or may be a reference potential corresponding to the insulated-gate semiconductor device 101 in the automobile. The low-level potential may be a low-level voltage for turning off the insulated-gate semiconductor device 101, and the low-level potential may be, for example, the ground potential of zero volt.

In the embodiment, a case where the insulated-gate semiconductor device 101 is an insulated-gate bipolar transistor (IGBT) is exemplified. The insulated-gate semiconductor device 101 has the gate electrode G connected to the control signal generation unit 100, a first main-electrode (collector electrode) C connected to the other end of the primary coil C1, and a second main-electrode (emitter electrode) E connected to a low-level potential, or a reference potential. The insulated-gate semiconductor device 101 electrically connects or disconnects between the emitter electrode E and the collector electrode C according to a switching control signal applied to the gate electrode G.

The insulated-gate semiconductor device 101 is turned on when the switching control signal has a high-level voltage. As a result, a main current (collector current) Ic flows from the power supply 104 through the primary coil C1 of the ignition coil 102. In addition, a time change dIc/dt of the main current Ic is determined according to the inductance of the primary coil C1 and the supply voltage of the power supply 104 and increases up to a preset current value. For example, the main current Ic increases up to about several A, tens of A, or several tens of A.

On the other hand, when the switching control signal becomes the low-level voltage, the insulated-gate semiconductor device 101 is turned off, and the main current (collector current) suddenly decreases. As the main current suddenly decreases, the voltage across the primary coil C1 suddenly increases due to the self-induction electromotive force and generates an induced electromotive force up to about several tens of kV at the voltage across the secondary coil C2. The ignition device supplies such a voltage of the secondary coil C2 to the ignition plug 103, so that the ignition plug 103 is discharged and the combustion gas is ignited.

Figure 2:
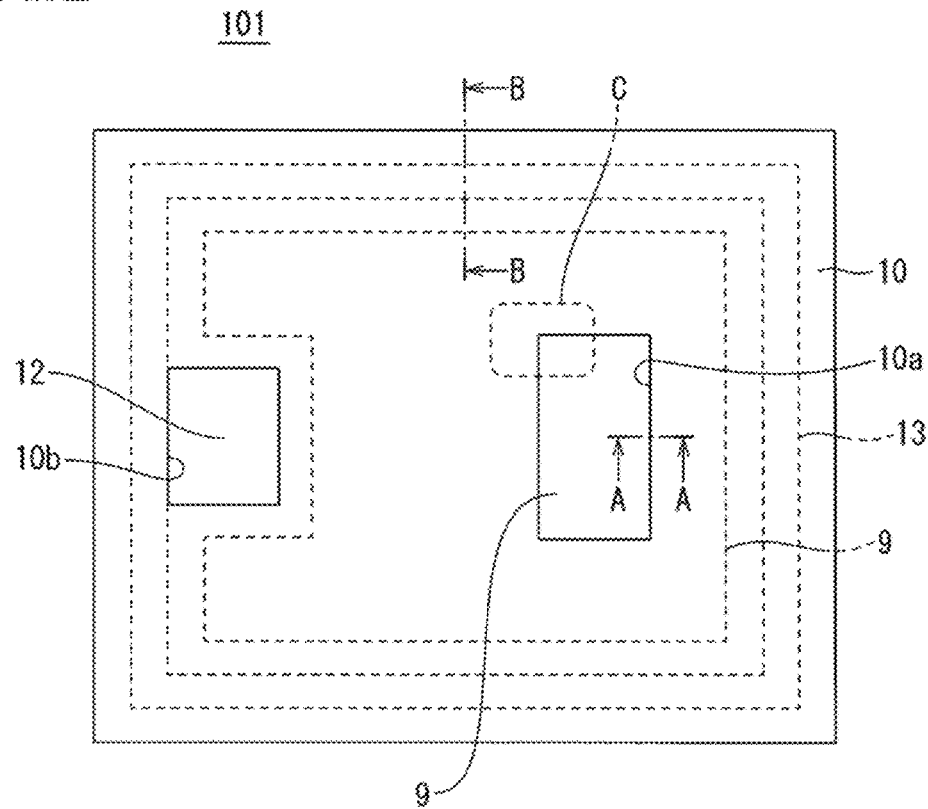
FIG. 2 is a plan view illustrating an example of the insulated-gate semiconductor device according to the embodiment of the present invention.
Figure 3:
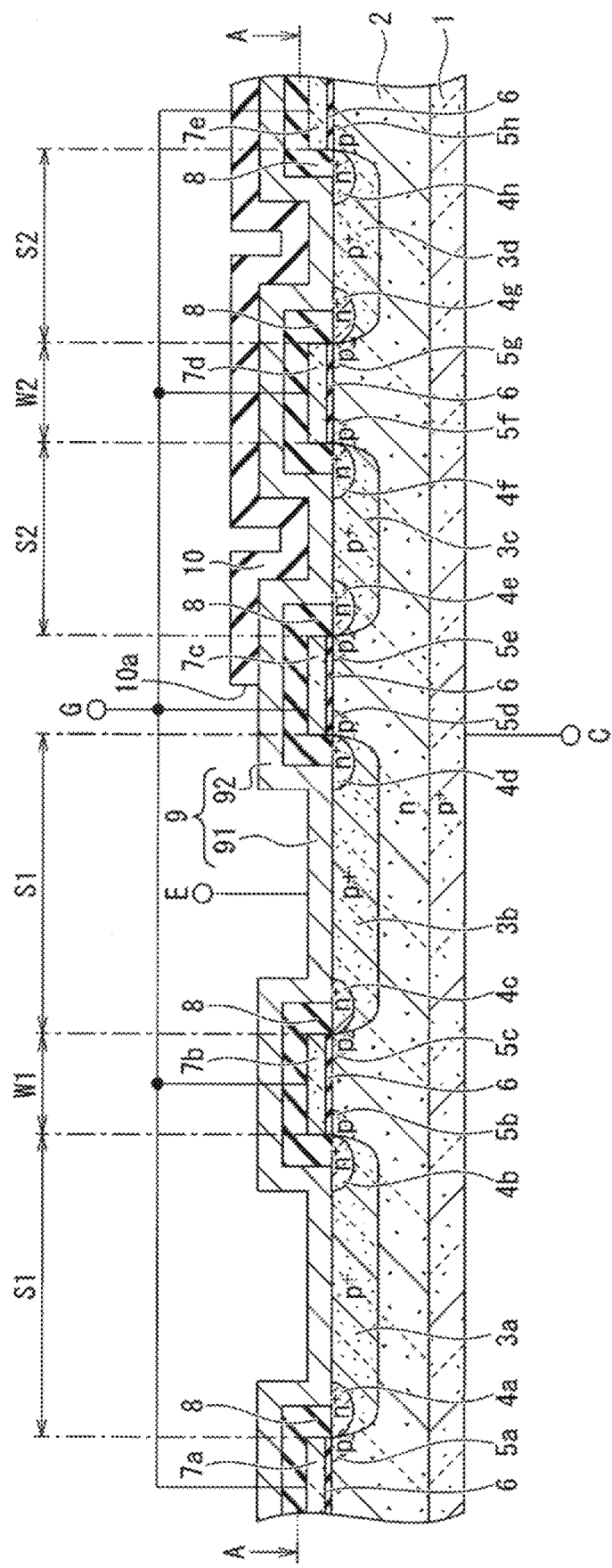
FIG. 3 is a cross-sectional view in the vertical direction taken on the A-A direction in FIG. 2.

Next, the structure of the insulated-gate semiconductor device 101 illustrated in FIG. 1 will be described with reference to FIGS. 2 to 6. As illustrated in the plan view of FIG. 2, the insulated-gate semiconductor device 101 according to the embodiment is built on the basis of a semiconductor chip having, for example, a rectangular planar shape. As illustrated in the plan view of FIG. 2 and the cross-sectional view of FIG. 3, the top surface of the semiconductor chip implementing the insulated-gate semiconductor device 101 according to the embodiment is covered with a protective film 10. A main-electrode (emitter electrode) 9 and a runner electrode 13 located under the protective film 10 illustrated in the cross-sectional views of FIGS. 3 and 6 are schematically illustrated as a pattern of broken lines in the plan view of FIG. 2. As illustrated in FIG. 2, the planar pattern of the main-electrode 9 has a C-shape having a concave portion surrounding a second opening 10b. The planar pattern of the runner electrode 13 has a frame shape so as to surround the periphery of the main-electrode 9.

In the protective film 10, a first opening 10a and the second opening 10b are provided in a rectangular planar pattern, respectively. The area of the first opening 10a is larger than the area of the second opening 10b. A portion of the main-electrode 9 is exposed as a rectangular planar pattern in the first opening 10a, and the exposed portion of the main-electrode 9 is defined as an emitter pad. The emitter pad corresponds to the emitter electrode E illustrated in FIG. 1. In a case where the insulated-gate semiconductor device 101 according to the embodiment is accommodated in a package or the like, the emitter pad, which is a portion of the main-electrode 9 exposed to the first opening 10a, is electrically connected to a terminal provided in the package by wire bonding or the like.

In the second opening 10b, a gate pad 12 is exposed as a rectangular planar pattern. The gate pad 12 is an electrode pad connected to the runner electrode 13. The gate pad 12 may be formed separately from the runner electrode 13 or may be integrally formed with the runner electrode 13 so as to form a portion of the runner electrode 13. The gate pad 12 corresponds to the gate electrode G illustrated in FIG. 1. In a case where the insulated-gate semiconductor device 101 according to the embodiment is accommodated in a package or the like, the gate pad 12 is electrically connected to a terminal provided in the package by wire bonding or the like.

FIG. 3 illustrates a cross section in the vertical direction taken on the A-A direction, in the vicinity of the first opening 10a of the protective film 10 illustrated in FIG. 2. As illustrated in FIG. 3, the insulated-gate semiconductor device 101 according to the embodiment has a multi-channel structure in which a plurality of unit-cells are arranged in parallel on a semiconductor chip. Each of the unit-cells of the insulated-gate semiconductor device 101 according to the embodiment includes an n-type carrier transport region (drift region) 2, p-type injection control regions (base regions) 5a, 5b, 5c, 5d, 5e, 5f, 5g, and 5h, $n^+$-type carrier-supply regions (emitter regions) 4a, 4b, 4c, 4d, 4e, 4f, 4g, and 4h, an insulated-gate electrode structure (6, 7a, 7b, 7c, 7d, and 7e), and an interlayer insulating film 8.

At the bottom of the carrier transport region 2, a $p^+$-type collector region 1 is connected so as to serve as the "$p^+$-type carrier-collecting region", and the carrier-collecting region is allocated on the bottom of the semiconductor chip. The carrier transport region 2 implements a portion of the semiconductor chip and is a semiconductor region capable of transporting majority carriers injected into the carrier transport region 2 by a drift electric field. For example, impurity ions of p-type such as boron (B) are implanted into the bottom surface of an n-type semiconductor substrate (Si wafer) serving as the carrier transport region 2, or p-type impurity elements are thermally diffused, so that the collector region 1 made of a $p^+$-type diffusion layer may be formed. Alternatively, the n-type carrier transport region 2 may be epitaxially grown on the collector region 1 made of a $p^+$-type semiconductor substrate (Si wafer). A bottom-surface electrode (not illustrated) to be a collector electrode may be arranged on the bottom surface side of the collector region 1. The bottom surface of the collector region 1 is connected to the collector electrode C.

A plurality of $p^+$-type well regions 3a to 3d are selectively provided in the upper portions of the carrier transport region 2. In the upper portions of both ends of the well regions 3a to 3d, the plurality of $n^+$-type carrier-supply regions 4a to 4h are selectively provided at a concentration higher than that of the carrier transport region 2. In the upper portions of the carrier transport region 2, a plurality of p-type injection control regions 5a to 5h are provided at a lower concentration than the well regions 3a to 3d. The injection control regions 5a to 5h are provided adjacently so as to form a p-n junction with the carrier-supply regions 4a to 4h at both ends of the well regions 3a to 3d. The injection control regions 5a to 5h control the amount of majority carriers injected into the carrier transport region 2.

By providing each of the injection control regions 5a to 5h in contact with the carrier-supply regions 4a to 4h at both ends of the well regions 3a to 3d, the well region 3a becomes a p-type region common to the injection control regions 5a and 5b. Similarly, the well region 3b becomes a p-type region common to the injection control regions 5c and 5d, the well region 3c becomes a p-type region common to the injection control regions 5e and 5f, and the well region 3d becomes a p-type region common to the injection control regions 5g and 5h.

The plurality of gate electrodes 7a to 7e are arranged above the carrier transport region 2 and the injection control regions 5a to 5h interposing the carrier transport region 2 through the gate insulating film 6. The gate insulating film 6 and the gate electrodes 7a to 7e implement the insulated-gate electrode structure (6, 7a to 7e). The insulated-gate electrode structure (6, 7a to 7e) electrostatically controls the surface potential of the injection control regions 5a to 5h to control the amount of majority carriers injected into the carrier transport region 2. The gate electrodes 7a to 7e are connected to the runner electrode 13 illustrated in FIG. 2 at a rearward portion of the paper, and the gate electrodes 7a to 7e are connected to the gate electrode G through the runner electrode 13.

As the gate insulating film 6, for example, a silicon oxide film ($SiO_2$ film) can be used. However, besides the $SiO_2$ film, a silicon oxynitride (SiON) film, a strontium oxide (SrO) film, a silicon nitride ($Si_3N_4$) film, or an aluminum oxide ($Al_2O_3$) film can also be used. Alternatively, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, or a bismuth oxide ($Bi_2O_3$) film may be used. In addition, a composite film obtained by selecting some of these single layer films and staking a plurality of the films can be used.

As the material of the gate electrodes 7a to 7e, for example, doped-polysilicon into which n-type impurities are heavily doped can be used. However, besides the doped-polysilicon, a refractory metal such as tungsten (W), molybdenum (Mo), or titanium (Ti) or a silicide of the refractory metal and the doped-polysilicon can be used. In addition, the material of the gate electrodes 7a to 7e may be a polycide which is a composite film of the doped-polysilicon and the silicide of the refractory metal.

On the gate electrodes 7a to 7e, the interlayer insulating film 8 is arranged so as to cover the gate electrodes 7a to 7e. As the interlayer insulating film 8, a phosphorus silica glass (PSG), a boron silica glass (BSG), a boron phosphosilicate glass (BPSG), a silicon nitride ($Si_3N_3$) film, or the like can be used. In addition, as the interlayer insulating film 8, a non-doped silicon oxide film ($SiO_2$ film) not containing phosphorus (P) or boron (B), which is called "NSG", can be employed.

In the interlayer insulating film 8 covering the gate electrodes 7a to 7e, contact holes are cut so as to expose portions of the well regions 3a to 3d and portions of the carrier-supply regions 4a to 4h at both ends of the well regions 3a to 3d. A main-electrode 9 is provided so as to be metallurgically connected to the well regions 3a to 3d and the carrier-supply regions 4a to 4h through the contact holes of the interlayer insulating film 8. In the cross section of FIG. 3, the main-electrode 9 is arranged as an integral conductor layer continuous on the well regions 3a to 3d, the carrier-supply regions 4a to 4h, and the interlayer insulating film 8. The main-electrode 9 is in ohmic contact with the well regions 3a to 3d and the carrier-supply regions 4a to 4h. As the material of the main-electrode 9, for example, aluminum (Al) or an alloy containing Al as a main component such as Al—Si, Al—Cu—Si, or Al—Cu can be used.

In the cross-sectional area illustrated in FIG. 3, the main-electrode 9 which is continuous on the well regions 3a to 3d, the carrier-supply regions 4a to 4h, and the interlayer insulating film 8 is illustrated to have such a periodic concavo-convex shape that the upper portion of the interlayer insulating film 8 is a convex portion. That is, the main-electrode 9 is illustrated to have such a periodic concavo-convex shape that a portion above the gate electrodes 7a to 7e becomes a convex portion. For this reason, the main-electrode 9 can be defined so as to be divided into an inter-electrode portion 91 serving as a concave portion which is in contact with the well regions 3a to 3d and the carrier-supply regions 4a to 4h between the gate electrodes 7a to 7e of the plurality of unit-cells and a covering portion 92 being continuous with the inter-electrode portion 91 and serving as a convex portion provided on the gate electrodes 7a to 7e of the plurality of unit-cells through the interlayer insulating film 8.

As illustrated in FIG. 3, the protective film 10 is arranged on a portion of the top surface of the main-electrode 9. The protective film 10 is located at the uppermost layer of the insulated-gate semiconductor device 101 according to the embodiment and has a function of protecting the surface of the insulated-gate semiconductor device 101 from foreign matters. The protective film 10 further has a function of suppressing expansion and contraction of the main-electrode 9 caused by a temperature cycle and reducing deterioration of the main-electrode 9. As the material of the protective film 10, for example, any one of single layer films of an $Si_3N_4$ film, a polyimide film, and an insulating film (TEOS film) formed by a chemical vapor deposition (CVD) method using an organic silicon based tetraethoxysilane (TEOS), or a composite film formed by stacking these films may be used.

One side of the rectangular first opening 10a exposing a portion of the main-electrode 9 illustrated in FIG. 2 is illustrated at the left end portion of the protective film 10 illustrated in FIG. 3, and the first opening 10a is illustrated to be cut in the protective film 10. The end portion of the first opening 10a of the protective film 10 is located on the gate electrode 7c, but the end portion of the first opening 10a of the protective film 10 is not limited to be located on the gate electrode 7c. For example, the end portion of the first opening 10a of the protective film 10 may be located between the gate electrodes 7c and 7d.

An interval S1 between the gate electrodes 7a and 7b in the unit-cell located in the first opening 10a illustrated on the left side of FIG. 3 is larger than an interval S2 between the gate electrodes 7d and 7e in the unit-cell located under the protective film 10 on the right side of FIG. 3. A width W1 of the gate electrodes 7a and 7b in the unit-cell located in the first opening 10a is equal to a width W2 of the gate electrodes 7d and 7e in the unit-cell located under the protective film 10. In addition, the width W1 of the gate electrodes 7a and 7b and the width W2 of the gate electrodes 7d and 7e may be different from each other.

A ratio S1/W1 of the interval S1 between the gate electrodes 7a and 7b to the width W1 of the gate electrodes 7a and 7b located in the first opening 10a is larger than a ratio S2/W2 of the interval S2 between the gate electrodes 7d and 7e to the width W2 of the gate electrodes 7d and 7e located under the protective film 10. The cell pitch of the unit-cells including the gate electrodes 7a and 7b located in the first opening 10a is wider than the cell pitch of the unit-cells including the gate electrodes 7d and 7e located under the protective film 10.

Figure 4:
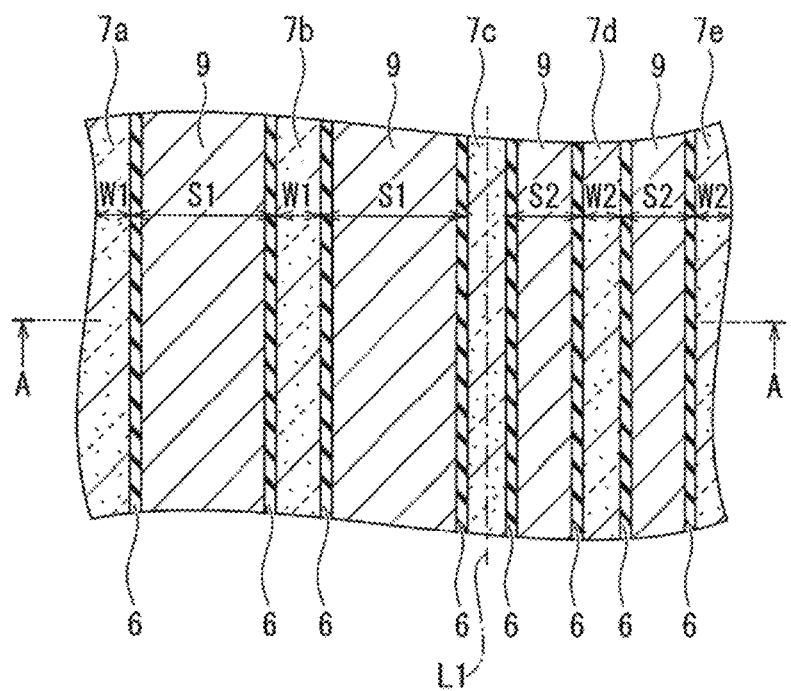
FIG. 4 is a cross-sectional view in the horizontal direction taken on the A-A direction in FIG. 3.

FIG. 4 is a cross-sectional view taken along the horizontal level at which the gate electrodes 7a to 7e illustrated in FIG. 3 are cut. In FIG. 4, the position of the end portion of the first opening 10a of the protective film 10 illustrated in FIG. 3 arranged on the gate electrodes 7a to 7e and the main-electrode 9 is schematically illustrated by a one-dot dashed line L1. As illustrated in FIG. 4, the gate electrodes 7a to 7e have planar patterns extending in parallel to each other in a stripe pattern.

Figure 5:
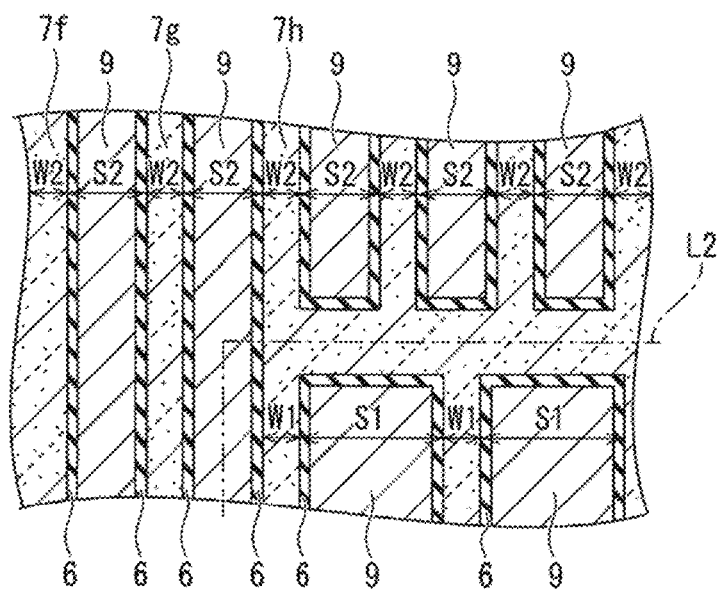
FIG. 5 is a cross-sectional view in the horizontal direction at the same horizontal level as that of FIG. 4, of a region C in FIG. 2.
Figure 6:
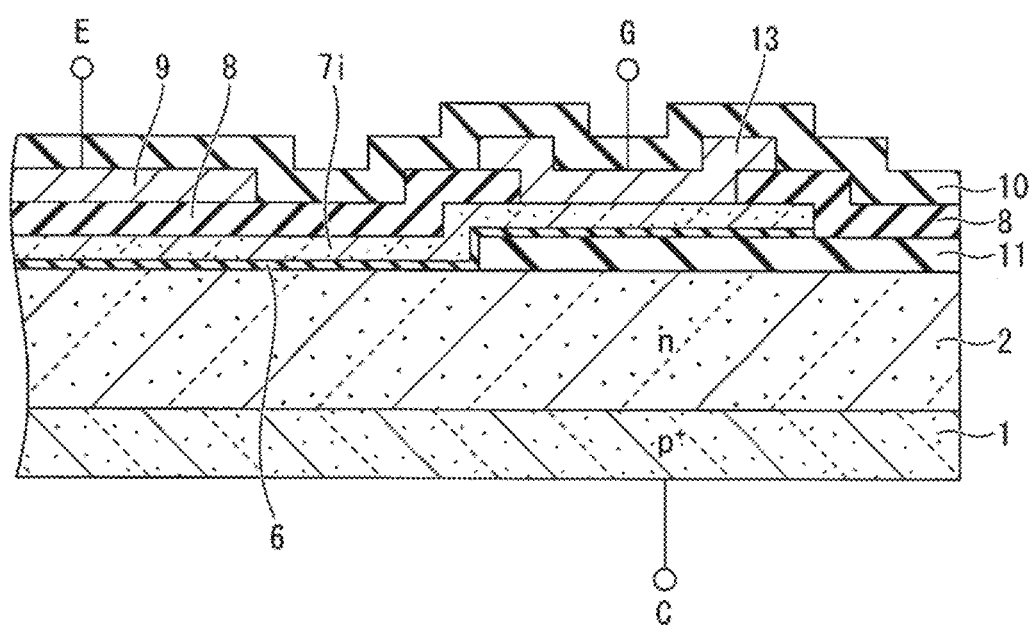
FIG. 6 is a cross-sectional view in the vertical direction taken on the B-B direction in FIG. 2.

FIG. 5 is a cross-sectional view in the horizontal direction at the same horizontal level as that of FIG. 4 of the region C in the vicinity of the corner of the first opening 10a of the protective film 10 illustrated in FIG. 2. In FIG. 5, the end portion of the first opening 10a of the protective film 10 is schematically illustrated by a one-dot dashed line L2. As illustrated on the lower right side of FIG. 5, the ratio S1/W1 of the interval S1 of the gate electrode 7h to the width W1 of the gate electrode 7h located in the first opening 10a is larger than the ratio S2/W2 of the interval S2 between the gate electrodes 7f, 7g, and 7h to the width W2 of the gate electrodes 7f, 7g, and 7h in the unit-cell located under the protective film 10.

FIG. 6 is a cross-sectional view in the vertical direction taken on the B-B direction in the vicinity of the end portion of the insulated-gate semiconductor device 101 illustrated in FIG. 2. As illustrated in FIG. 6, an edge-side insulating film 11 is provided in the vicinity of the end portion of the semiconductor chip implementing the insulated-gate semiconductor device 101 so as to cover the carrier transport region 2. A gate electrode 7i is arranged so as to cover a portion of the edge-side insulating film 11. As illustrated in FIG. 6, the gate electrode 7i is provided so as to cover a portion of the top surface of the edge-side insulating film 11 from the top surface of the carrier transport region 2 through a step difference portion at the end portion of the edge-side insulating film 11.

The runner electrode 13 is selectively arranged on the gate electrode 7i located above the edge-side insulating film 11 and is metallurgically connected to the gate electrode 7i. Although a specific connection structure is omitted in illustration, the runner electrode 13 is also metallurgically connected to the gate electrodes 7a to 7e to electrically connect the gate electrodes 7a to 7e and 7i and the gate electrode G. Since the gate electrode 7i is formed so as to cover a portion of the edge-side insulating film 11, the edge-side insulating film 11 is formed with such a thickness that cracks, chipping, fractures, or the like are not caused by the step difference of the gate electrode 7i. The edge-side insulating film 11 is formed with a thickness of, for example, about several hundreds of nm.

In the insulated-gate semiconductor device 101 according to the embodiment, when the insulated-gate semiconductor device is turned on, the main current as the on-current generates Joule heat due to the resistance of the insulated-gate semiconductor device 101, and when the insulated-gate semiconductor device is turned off, the heat is dissipated. In some cases, such a temperature cycle causes deterioration such as cracks or the like in the stacked film structure including the gate electrodes 7a to 7e provided on the carrier transport region 2, the interlayer insulating film 8, the main-electrode 9, and the protective film 10 due to a difference in linear expansion coefficient among the carrier transport region 2, the gate electrodes 7a to 7e, the interlayer insulating film 8, the main-electrode 9, and the protective film 10.

For example, the material of the semiconductor base body (1, 2) and the gate electrodes 7a to 7e may be Si, the material of the interlayer insulating film 8 may be BPSG, the material of the main-electrode 9 may be Al—Si, and the material of the protective film 10 may be silicon nitride ($Si_3N_4$). At this time, the linear expansion coefficient $\alpha_{Si}$ of Si=$3.9 \times 10^{-6}$/K, the linear expansion coefficient $\alpha_{BPSG}$ of BPSG=0.5 to $0.7 \times 10^{-6}$/K, the linear expansion coefficient $\alpha_{Al-Si}$ of Al—Si=$20 \times 10^{-6}$/K, and the linear expansion coefficient $\alpha_{SiN}$ of $Si_3N_4$=$2.6 \times 10^{-6}$/K. That is, the linear expansion coefficient $\alpha_{Al-Si}$ of Al—Si is about ten times larger than the linear expansion coefficients $\alpha_{Si}$, $\alpha_{BPSG}$, and $\alpha_{SiN}$ of the other stacked films. In particular, in a case where the Al—Si film is formed on the BPSG film as the interlayer insulating film 8, the ratio $\alpha_{Al-Si}/\alpha_{BPSG}$ of the linear expansion coefficients is about 30 to 40.

On the other hand, when the $Si_3N_4$ film is formed as the protective film 10 on the Al—Si film, since the linear expansion coefficient $\alpha_{SiN}$ of the $Si_3N_4$ film is small, expansion and contraction of the Al—Si film due to the temperature cycle is suppressed, and deterioration is also reduced. However, the main-electrode 9 requires a bonding wire for connecting to the low-level potential, and as illustrated in FIG. 3, there is a portion where a portion of the main-electrode 9 is exposed to the first opening 10a of the protective film 10. As a result, the deterioration of the portion of the main-electrode 9 stacked on the gate electrodes 7a to 7e of the first opening 10a through the interlayer insulating film 8 most easily occurs.

Since such deterioration of the main-electrode 9 does not easily occur between the gate electrodes 7a to 7e without the interlayer insulating film 8 interposed, when the area ratio of the main-electrode 9 located between the gate electrodes 7a to 7e is increased, the deterioration of the entire main-electrode 9 slowly occurs. On the other hand, as can be understood from FIG. 3, the main current concentrates under the gate electrodes 7a to 7e and flows in a direction (vertical direction) perpendicular to the main surface of the semiconductor chip. For this reason, in a case where the area ratio of the gate electrodes 7a to 7e is decreased, the on-resistance increases, and the saturation current and the transconductance become small, so that the inherent performance of the switch of the insulated-gate semiconductor device 101 deteriorates.

Therefore, in the embodiment, on the basis of the above described concavo-convex shape including the convex portions on the gate electrodes 7a to 7e of the main-electrode 9 illustrated in FIG. 3, the main-electrode 9 is defined so as to be divided into the inter-electrode portion 91 between the gate electrodes 7a to 7e and the covering portion 92 provided on the gate electrodes 7a to 7e. Then, the area ratio of the inter-electrode portion 91 to the covering portion 92 of the main-electrode 9 at the position exposed to the first opening 10a of the protective film 10 is set to be larger than the area ratio of the inter-electrode portion 91 to the covering portion 92 of the main-electrode 9 located under the protective film 10. That is, in the embodiment, the ratio S1/W1 of the interval S1 between the gate electrodes 7a and 7b to the width W1 of the gate electrodes 7a and 7b located in the first opening 10a of the protective film 10 is set to be larger than the ratio S2/W2 of the interval S2 between the gate electrodes 7d and 7e to the width W2 of the gate electrodes 7d and 7e located under the protective film 10.

COMPARATIVE EXAMPLE

Figure 7:
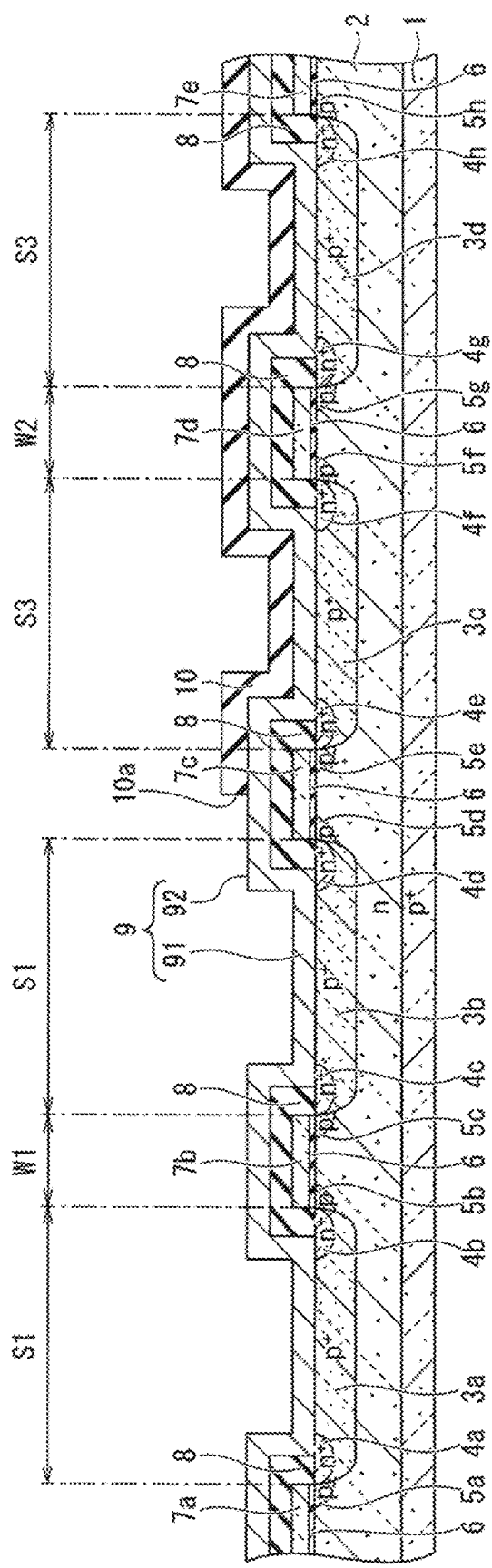
FIG. 7 is a cross-sectional view illustrating an example of an insulated-gate semiconductor device according to Comparative Example.

Herein, an insulated-gate semiconductor device according to Comparative Example will be described in comparison. As illustrated in FIG. 7, the insulated-gate semiconductor device according to Comparative Example is different from the insulated-gate semiconductor device according to the embodiment in a feature such that the area ratio of the inter-electrode portion 91 to the covering portion 92 of the main-electrode 9 located in the first opening 10a of the protective film 10 is equal to the area ratio of the inter-electrode portion 91 to the covering portion 92 of the main-electrode 9 located under the protective film 10.

In the insulated-gate semiconductor device according to Comparative Example, the ratio S1/W1 of the interval S1 between the gate electrodes 7a and 7b to the width W1 of the gate electrodes 7a and 7b located in the first opening 10a of the protective film 10 is equal to a ratio S3/W2 of an interval S3 between the gate electrodes 7d and 7e to the width W2 of the gate electrodes 7d and 7e located under the protective film 10 (S3/W2=S1/W1). The width W1 of the gate electrodes 7a and 7b located in the first opening 10a and the width W2 of the gate electrodes 7d and 7e located under the protective film 10 are equal to each other. In addition, the interval S1 between the gate electrodes 7a and 7b located in the first opening 10a and the interval S3 between the gate electrodes 7d and 7e located under the protective film 10 are equal to each other.

In a case where the chip sizes of the IGBTs are the same, as the sum of the width W1 (=W2) of the gate electrodes 7a to 7e and the interval S1 (=S3) decreases, the saturation current increases. However, as the width W1 (=W2) of the gate electrodes 7a to 7e decreases, the width of the carrier-supply regions 4a to 4h decreases, and thus, the saturation current also decreases. For this reason, it is preferable to decrease the interval S1 (=S3) between the gate electrodes 7a to 7e in order to cause the saturation current to flow. On the other hand, when the interval S1 (=S3) between the gate electrodes 7a to 7e is decreased, the ratio of the interlayer insulating film 8 increases, and thus, the main-electrode 9 is easily deteriorated. When the interval S1 (=S3) between the gate electrodes 7a to 7e of the entire chip is increased in order to prevent deterioration of the main-electrode 9, the saturation current density becomes small, so that the chip size is increased.

(Effectiveness of Area Ratio)

On the other hand, according to the insulated-gate semiconductor device 101 pertaining to the embodiment, the area ratio of the inter-electrode portion 91 to the covering portion 92 of the main-electrode 9 located in the first opening 10a of the protective film 10 is set to be locally larger than the area ratio of the inter-electrode portion 91 to the covering portion 92 of the main-electrode 9 located under the protective film 10. Therefore, it is possible to decrease the area of the covering portion 92 of the main-electrode 9 on the gate electrodes 7d and 7e located in the first opening 10a, which is the most easily deteriorated portion of the main-electrode 9, and thus, the deterioration of the main-electrode 9 caused by the temperature cycle is reduced. Meanwhile, in the unit-cell located in the first opening 10a, when the carrier-supply regions 4a to 4d are enlarged, it is difficult for the main current to flow. However, in comparison with a case where the carrier-supply regions 4a to 4h of the unit-cells of the entire chip are enlarged, the decrease in the main current can be reduced, and thus, the deterioration in electrical characteristics can be suppressed. Alternatively, it is possible to suppress an increase in chip size required for suppressing the deterioration in electrical characteristics.

Figure 8A:
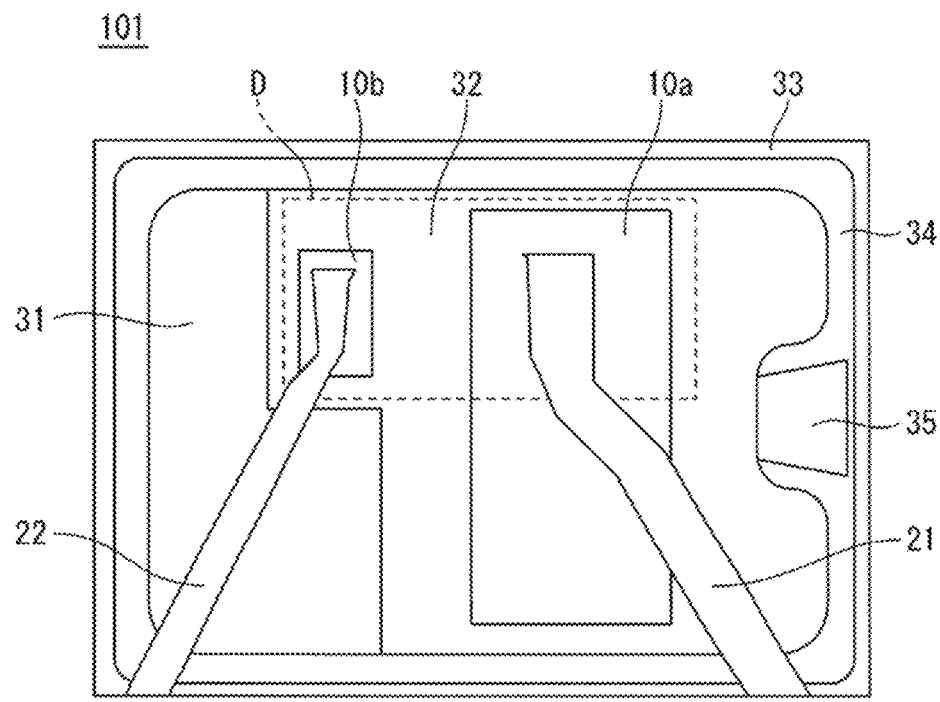
FIG. 8A is a plan view of the insulated-gate semiconductor device according to the embodiment of the present invention.

FIG. 8A is a schematic plan view of the insulated-gate semiconductor device 101 according to the embodiment. FIG. 8A illustrates a case where the protective film 10 is removed. The insulated-gate semiconductor device 101 includes an IGBT portion (element portion) 32 in which an IGBT is arranged and a control IC portion 31 for controlling the IGBT. An n-type channel stopper 33 is provided on the surface of the outer peripheral portion of the insulated-gate semiconductor device 101. A breakdown-voltage blocking-portion 34 is provided between the n-type channel stopper 33 and the IGBT portion 32 and the control IC portion 31. A protection diode 35 formed on a semiconductor substrate through an insulating film is provided in the breakdown-voltage blocking-portion 34. One end of the protection diode 35 is connected to the n-type channel stopper 33 or the like with a metal wiring (not illustrated), and the other end of the protection diode 35 is connected to the gate electrode of the IGBT with a metal wiring (not illustrated). That is, the protection diode 35 is connected between the gate electrode and the collector electrode of the IGBT. A bonding wire 21 made of Al is connected to the first opening 10a of the protective film 10. A bonding wire 22 made of Al is connected to the second opening 10b of the protective film 10.

Figure 8B:
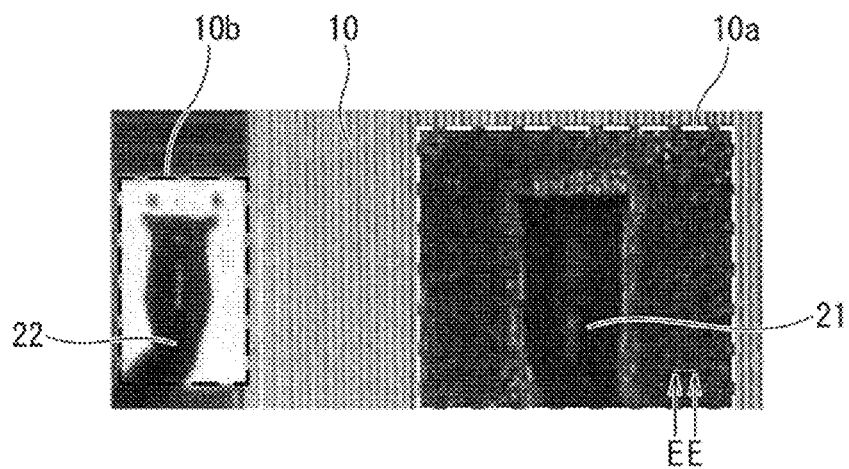
FIG. 8B is an optical microscope photograph of a region D of FIG. 8A.

FIG. 8B is an optical microscope photograph of the region D of FIG. 8A. In FIG. 8B, the region of the first opening 10a of the protective film 10 is observed in black, and thus, it can be understood that the Al—Si in the region of the first opening 10a is uniformly deteriorated. On the other hand, in the region of the second opening 10b of the protective film 10, the unit-cells are not arranged, and it is difficult to generate heat, so that it can be understood that the region is not blackened, and the Al—Si is not deteriorated.

Figure 9:
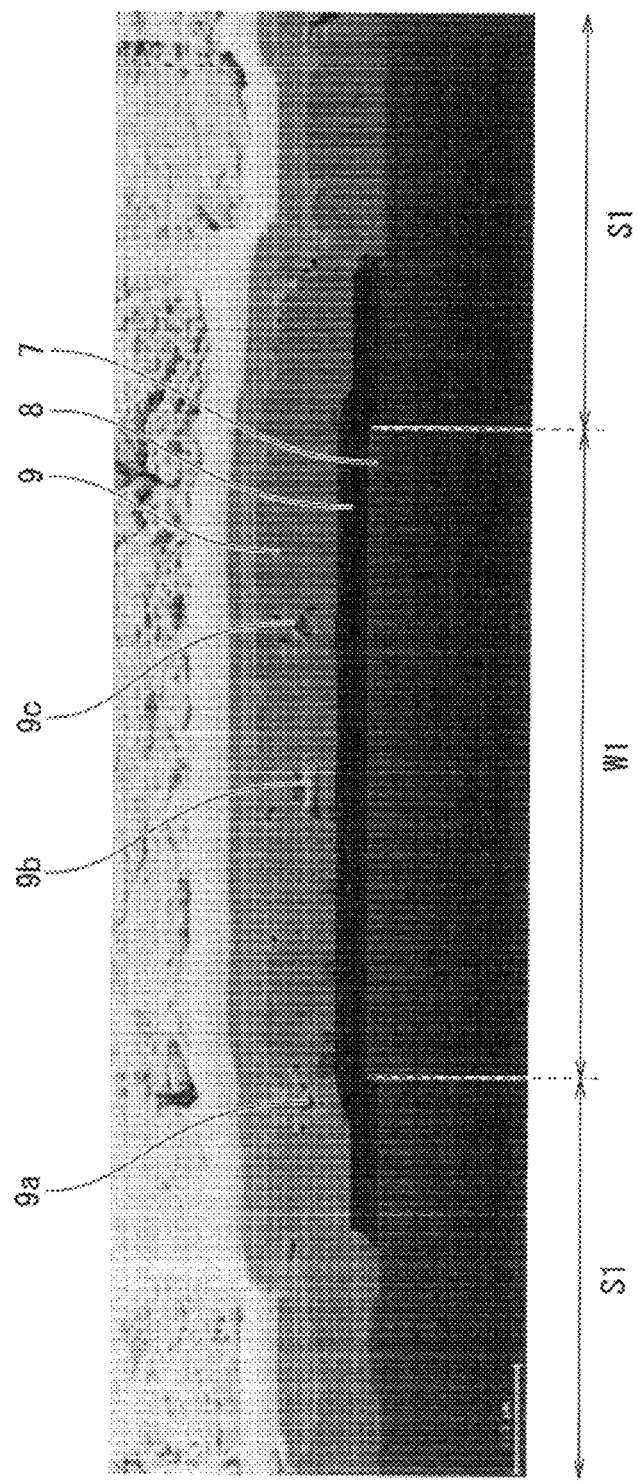
FIG. 9 is a scanning electron microscope (SEM) photograph of a cross section taken on the E-E direction in FIG. 8B.

FIG. 9 is an SEM photograph of a cross section in the vertical direction taken on the E-E direction in FIG. 8B. As shown in FIG. 9, the interlayer insulating film 8 made of BPSG is arranged on the gate electrode 7, and the main-electrode 9 made of Al—Si is arranged on the interlayer insulating film 8. In FIG. 9, cracks 9a to 9c are observed in the portion of the covering portion, which is arranged on the gate electrode 7 of the main-electrode 9 through the interlayer insulating film 8. On the other hand, cracks do not occur in the portion of the inter-electrode portion, which is arranged between the gate electrodes 7 of the main-electrode 9.

(Manufacturing Method)

Next, an example of the method of manufacturing the insulated-gate semiconductor device 101 according to the embodiment will be described with reference to FIGS. 10 to 15. The method of manufacturing the insulated-gate semiconductor device 101 according to the embodiment described below is merely an example, and various other manufacturing methods including modifications can be realized within the scope of the invention disclosed in the claims.

Figure 10:
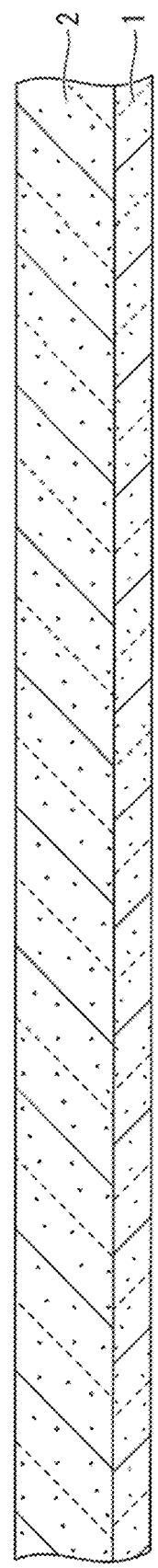
FIG. 10 is a process cross-sectional view illustrating an example of a method of manufacturing the insulated-gate semiconductor device according to the embodiment of the present invention.

First, a semiconductor substrate (Si substrate) made of n-type Si is prepared. The impurity ions of p-type are implanted into the bottom surface of the Si substrate. After that, the implanted impurity ions of p-type are activated and thermally diffused by annealing. As a result, as illustrated in FIG. 10, the $p^+$-type collector region 1, or the $p^+$-type carrier-collecting region 1 is formed on the bottom surface of the Si substrate, and the n-type carrier transport region 2 is defined on the carrier-collecting region 1. In addition, the carrier transport region 2 may be epitaxially grown on the top surface of the carrier-collecting region 1.

Next, a photoresist film is coated on the top surface of the carrier transport region 2, and the photoresist film is delineated by a process such as exposure, development, or the like using a photolithography technique. By using the delineated photoresist film as a mask for ion implantation, impurity ions of p-type are selectively implanted into the top surface of the carrier transport region 2. After that, the photoresist film is removed, and annealing is performed to form the p-type well regions 3a to 3d on the carrier transport region 2 as a periodic repetitive pattern.

Figure 11:
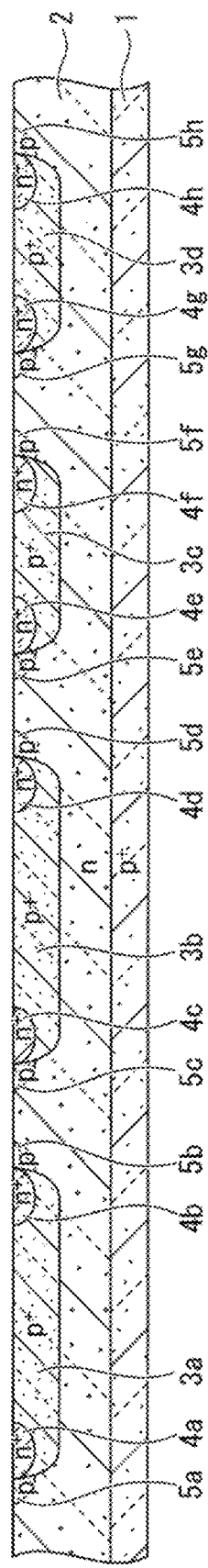
FIG. 11 is a process cross-sectional view continued from FIG. 10 illustrating the example of the method of manufacturing the insulated-gate semiconductor device according to the embodiment of the present invention.

Next, a new photoresist film is coated on the top surface of the carrier transport region 2, and the photoresist film is delineated by being aligned with the pattern of the carrier-supply regions 4a to 4h by the photolithography technique. By using the delineated photoresist film as a mask for ion implantation, impurity ions of n-type are selectively implanted into the top surface of the carrier transport region 2 in a projection range which is shallower than that of the impurity ions of p-type. After that, the photoresist film is removed. Next, a new photoresist film is coated on the top surface of the carrier transport region 2, and the photoresist film is similarly delineated by being aligned with the pattern of the injection control regions 5a to 5h. By using the delineated photoresist film as a mask for ion implantation, impurity ions of p-type are selectively implanted into the top surface of the carrier transport region 2 in substantially the same projection range as that of impurity ions of n-type. After that, by removing the photoresist film and annealing, as illustrated in FIG. 11, at the positions of both ends of each of the p-type well regions 3a to 3d, the $n^+$-type carrier-supply regions 4a to 4h and the p-type injection control regions 5a to 5h are formed so as to partially overlap.

Figure 12:
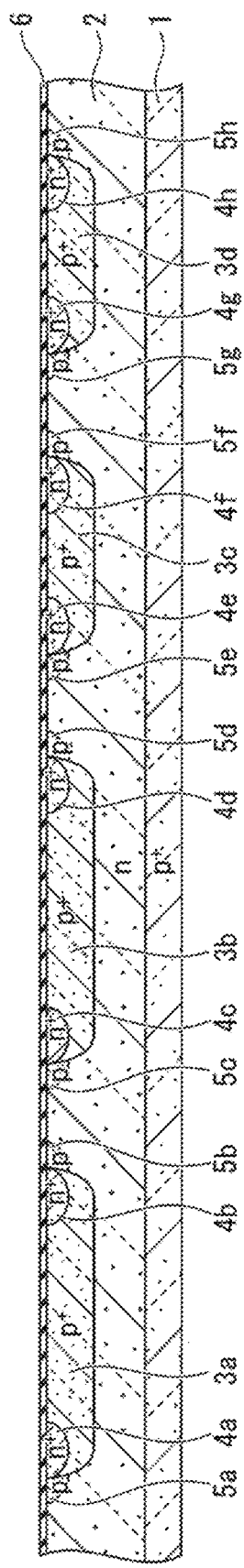
FIG. 12 is a process cross-sectional view continued from FIG. 11 illustrating the example of the method of manufacturing the insulated-gate semiconductor device according to the embodiment of the present invention.

Next, as illustrated in FIG. 12, a gate insulating film 6 such as an $SiO_2$ film is formed on the top surfaces of the carrier transport region 2, the well regions 3a to 3d, the carrier-supply regions 4a to 4h, and the injection control regions 5a to 5h by a thermal oxidation method, a chemical vapor deposition (CVD), or the like.

Figure 13:
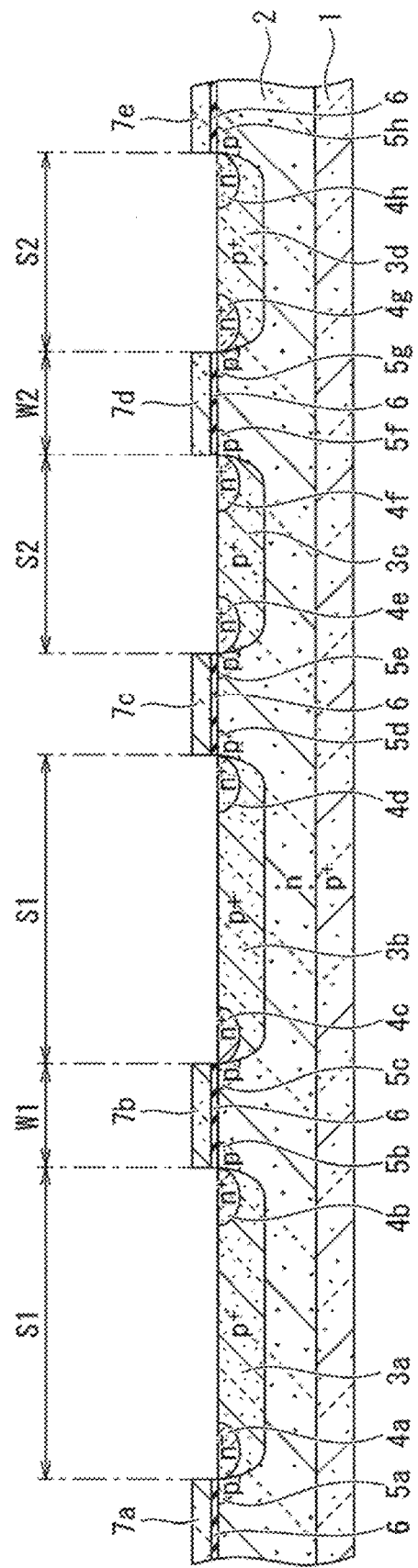
FIG. 13 is a process cross-sectional view continued from FIG. 12 illustrating the example of the method of manufacturing the insulated-gate semiconductor device according to the embodiment of the present invention.
Figure 14:
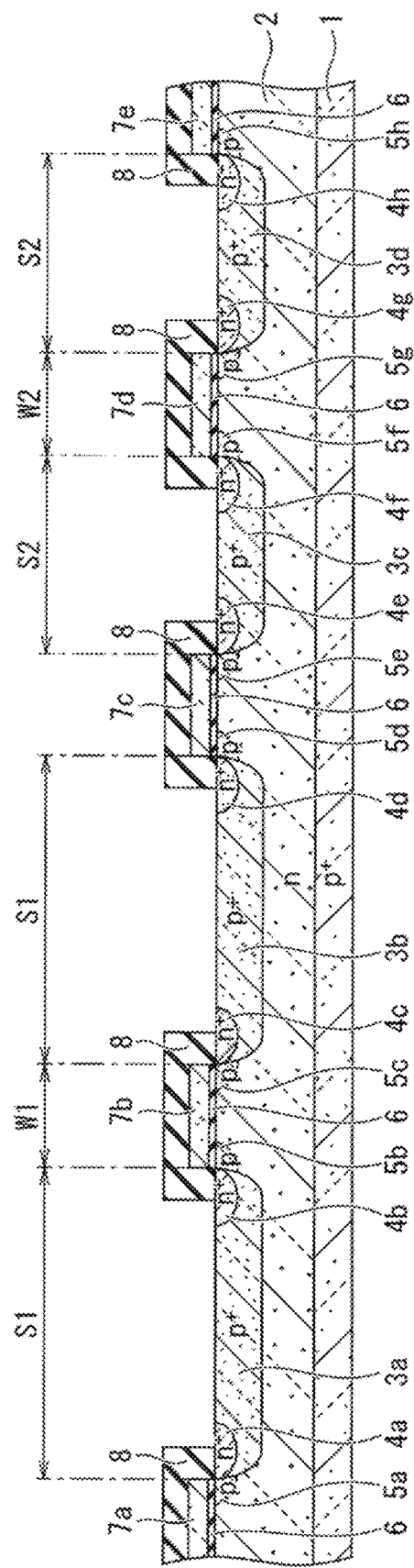
FIG. 14 is a process cross-sectional view continued from FIG. 13 illustrating the example of the method of manufacturing the insulated-gate semiconductor device according to the embodiment of the present invention.
Figure 15:
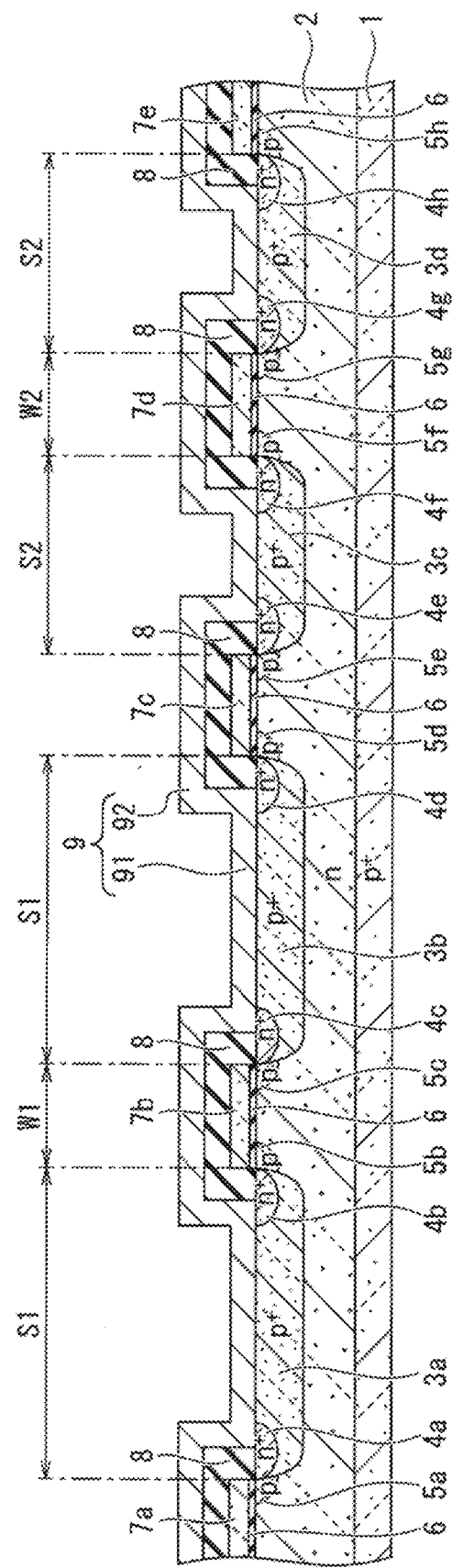
FIG. 15 is a process cross-sectional view continued from FIG. 14 illustrating the example of the method of manufacturing the insulated-gate semiconductor device according to the embodiment of the present invention.

Next, a doped-polysilicon layer doped with impurities such as phosphorus (P) at a high concentration is deposited on the top surface of the gate insulating film 6 by the CVD method or the like. A portion of the doped-polysilicon layer and the gate insulating film 6 is selectively removed by a photolithography technique and dry etching. After that, the photoresist film is removed. As a result, as illustrated in FIG. 13, a pattern of the gate electrodes 7a to 7e made of a doped-polysilicon layer is formed. In addition, the gate insulating film 6 other than the gate insulating film located directly under the gate electrodes 7a to 7e is removed, and the top surfaces of the well regions 3a to 3d and the carrier-supply regions 4a to 4h are exposed.

Herein, the gate electrodes 7a to 7e are formed so that the interval S1 between the gate electrodes 7a and 7b, which is to be located in the first opening 10a illustrated in FIG. 3, is larger than the interval S2 between the gate electrodes 7d and 7e, which to be is located under the protective film 10. As a result, the ratio S1/W1 of the interval S1 between the gate electrodes 7a and 7b to the width W1 of the gate electrodes 7a and 7b is larger than the ratio S2/W2 of the interval S2 between the gate electrodes 7d and 7e to the width W2 of the gate electrodes 7d and 7e.

Next, the interlayer insulating film 8 is deposited on the top surfaces of the well regions 3a to 3d, the carrier-supply regions 4a to 4h, and the gate electrodes 7a to 7e by the CVD method or the like. Then, a portion of the interlayer insulating film 8 is selectively removed by the photolithography technique and dry etching, so that the top surfaces of the well regions 3a to 3d and the carrier-supply regions 4a to 4h are exposed. Although not illustrated in the drawing, gate contact holes are also cut in the interlayer insulating film so that a portion of the gate electrodes 7a to 7e is exposed, for example, at a rearward portion of the paper. In the structure in which the gate surface wiring is connected to the gate electrodes 7a to 7e, the gate contact holes may be cut in the interlayer insulating film so that a portion of the gate surface wiring is exposed at near side and rear side of the paper, or the like.

Next, a metallic layer such as an Al—Si film is deposited on the entire surface of the interlayer insulating film 8, the well regions 3a to 3d, and the carrier-supply regions 4a to 4h by a sputtering method, an evaporation method, or the like. A pattern of a main-electrode 9 and a gate surface interconnection (not illustrated) is formed by delineating a metallic layer such as an Al—Si film by the photolithography technique, RIE, or the like. As a result, the pattern of the main-electrode 9 and the pattern of the gate surface interconnection are separated. Next, as illustrated in FIG. 3, the protective film 10 made of $Si_3N_4$ film or the like is deposited, so that the insulated-gate semiconductor device 101 according to the embodiment is completed.

As described above, according to the method of manufacturing the insulated-gate semiconductor device 101 pertaining to the embodiment, it is possible to realize the insulated-gate semiconductor device 101 capable of suppressing a deterioration of an electrode caused by a temperature cycle in which ON-operations and OFF-operations are repeated while suppressing a deterioration in electrical characteristics and an increase in chip size.

OTHER EMBODIMENTS

As described above, the invention has been described according to the embodiments, but it should not be understood that the description and drawings implementing a portion of this disclosure limit the invention. Various alternative embodiments of the present invention, examples, and operational techniques will be apparent to those skilled in the art from this disclosure.

For example, in the insulated-gate semiconductor device according to the embodiment, a case where the gate electrodes 7a to 7e of the unit-cells have a planar pattern extending in parallel to each other in a stripe shape is exemplified, but the invention is not limited the stripe shape. For example, the gate electrode of the unit-cell may have a planar pattern such as a dot shape, and the insulated-gate semiconductor device may have a multi-channel structure in which a plurality of unit-cells are arranged in parallel on a semiconductor chip. In this case, the area ratio of the inter-electrode portion 91 to the covering portion 92 of the main-electrode 9 located in the first opening 10a may be set to be larger than the area ratio of the inter-electrode portion 91 to the covering portion 92 of the main-electrode 9 located under the protective film 10.

For example, although a planar vertical IGBT is exemplified as an insulated-gate semiconductor device according to the embodiment, the insulated-gate semiconductor device according to the invention is applicable to a trench gate vertical IGBT and a planar or trench gate vertical type MOSFET. Furthermore, the power semiconductor element may be a vertical MOSSIT and a planar MOSSIT or may be more generally a vertical MIS transistor or a planar MIS transistor. Furthermore, the insulated-gate semiconductor device according to the embodiment may be an SI thyristor. In addition, although the insulated-gate semiconductor device according to the embodiment is suitable as a power switching element for an igniter, which is used in an internal combustion engine of, for example, an automobile, the insulated-gate semiconductor device is also applicable to various other switching elements.

As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. An insulated-gate semiconductor device having a multi-channel structure with a plurality of unit-cells arranged in parallel comprised in a semiconductor chip, comprising:
    a main-electrode configured to flow a main current in the semiconductor chip, the main-electrode including:
    an inter-electrode portion metallurgically connected to the semiconductor chip between a plurality of gate electrodes of the unit-cells, and
    a covering portion being continuous with the inter-electrode portion, configured to cover the gate electrodes through an interlayer insulating film on the gate electrodes; and
    a protective film partially covering the main-electrode,
    wherein an area ratio of the inter-electrode portion to a part of the covering portion, which is exposed by a first opening cut in the protective film, is larger than an area ratio of the inter-electrode portion to another part of the covering portion, the another part is located under the protective film.

2. The insulated-gate semiconductor device of claim 1, wherein each of the unit-cells includes:
    a carrier transport region of a first conductivity type implementing a portion of the semiconductor chip, configured to transport carriers serving as the main current;
    an injection control region of a second conductivity type provided on the carrier transport region, configured to control an amount of carriers injected into the carrier transport region;
    a gate insulating film provided on a surface of the injection control region, configured to control electrostatically a surface potential of the injection control region, by a gate voltage applied to the gate electrode provided on the gate insulating film; and
    a carrier-supply region of a first conductivity type having a impurity concentration higher than that of the carrier transport region, configured to form a p-n junction with the injection control region, and to supply the carriers to the injection control region through an ohmic contact with the main-electrode.

3. The insulated-gate semiconductor device of claim 1, wherein the gate electrodes of each of the unit-cells have a planar pattern extending in parallel to each other, and a ratio of an interval between the gate electrodes to a width of the gate electrode exposed by the first opening is larger than a ratio of an interval between the gate electrodes to a width of the gate electrode located under the protective film.

4. The insulated-gate semiconductor device of claim 1, wherein a second opening is cut in the protective film so as to expose a part of the gate electrode, configured to serve as a gate pad for electrically connecting to external circuit, and an area of the first opening is larger than an area of the second opening.

5. The insulated-gate semiconductor device of claim 1, wherein a plurality of saturation currents flow through the unit-cells, respectively.

6. The insulated-gate semiconductor device of claim 1, wherein the main-electrode serves as an emitter electrode of an insulated-gate bipolar transistor.

* * * * *